United States Patent
Li et al.

(10) Patent No.: US 10,068,544 B2
(45) Date of Patent: Sep. 4, 2018

(54) GATE DRIVER ON ARRAY DRIVING CIRCUIT AND LCD DEVICE

(71) Applicant: SHENZHEN CHINA STAR OPTOELECTRONICS TECHNOLOGY CO., LTD., Guangdong (CN)

(72) Inventors: Wenying Li, Guangdong (CN); Shujhih Chen, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 128 days.

(21) Appl. No.: 15/325,962

(22) PCT Filed: Dec. 20, 2016

(86) PCT No.: PCT/CN2016/111055
§ 371 (c)(1),
(2) Date: Jan. 12, 2017

(87) PCT Pub. No.: WO2018/053957
PCT Pub. Date: Mar. 29, 2018

(65) Prior Publication Data
US 2018/0218698 A1    Aug. 2, 2018

(30) Foreign Application Priority Data

Sep. 21, 2016    (CN) .......................... 2016 1 0836750

(51) Int. Cl.
*G09G 3/36*    (2006.01)

(52) U.S. Cl.
CPC ....... *G09G 3/3677* (2013.01); *G09G 2310/08* (2013.01); *G09G 2320/0214* (2013.01)

(58) Field of Classification Search
CPC ..................... G09G 3/3677; G09G 2310/0286
See application file for complete search history.

(56) References Cited

U.S. PATENT DOCUMENTS

2015/0318051 A1* 11/2015 Hong ..................... G11C 19/28
                                                                     377/68
2016/0307537 A1* 10/2016 Park ..................... G09G 3/3677

\* cited by examiner

*Primary Examiner* — Kevin M Nguyen
(74) *Attorney, Agent, or Firm* — WPAT, PC

(57) ABSTRACT

The present disclosure proposes a scanning driver for driving scan lines row by row. The scanning driver includes cascaded scanning circuits. Each scanning circuit includes a pull-up control module, a driving module, a pull-down module, a pull-down holding module, and a constant low voltage supply. The pull-up control module includes a first transistor, a second transistor, and a third transistor.

20 Claims, 3 Drawing Sheets

GATE DRIVER ON ARRAY DRIVING CIRCUIT AND LCD DEVICE

BACKGROUND

1. Field of the Disclosure

The present disclosure relates to the field of liquid crystal displays (LCDs), and more particularly to a gate driver on array (GOA) driving circuit and an LCD device.

2. Description of the Prior Art

A gate driver on array circuit (abbreviated as GOA circuit) uses a scan driving circuit that is formed on an array substrate by processing of an array substrate of a traditional thin film transistor-liquid crystal display (TFT-LCD), thus, a driving method for scanning a pixel structure row by row is achieved.

A conventional scan driving circuit includes a plurality of GOA unit. Each GOA unit for driving a scan line includes a pull-up control module, a driving module, a pull-down module, and a pull-down holding module.

The conventional pull-up control module is usually formed by one single transistor. The threshold of a voltage imposed on the transistor tends to become a negative value when the scan driving circuit works in the high temperature condition. Accordingly, the transistor in the pull-up control module is inclined to leak electricity. Further, the variation of an input signal in the pull-up control module may have a big influence on an output signal in the driving module, which affects the reliability of the scanning driver.

Therefore, the prior art is defective and needs to be improved and developed.

SUMMARY

It is therefore an objective of the present disclosure to provide a gate driver on array (GOA) circuit and a liquid crystal display (LCD) device with low current leakage and high reliability to solve the technical issue of conventional scan driving circuit.

According to the present disclosure, a scanning driver for driving scan lines row by row is provided. The scanning driver comprises cascaded scanning circuits. Each scanning circuit comprises:

a pull-up control module, configured to generate a scan voltage level signal in response to a scanning signal from a previous stage scanning circuit;

a driving module, configured to pull up a scanning signal outputted to a scan line coupled to a current stage scanning circuit in response to the scan voltage level signal and a clock signal fed to the current stage scanning circuit;

a pull-down module, configured to pull down the scan voltage level signal in response to a scanning signal from a next stage scanning circuit;

a pull-down holding module, configured to hold the scan voltage level signal at a low voltage level; and a constant low voltage supply, configured to supply a constant low voltage, wherein the pull-up control module comprises: a first transistor comprising a control terminal coupled to the scanning signal of the previous stage scanning circuit, an input terminal coupled to the scanning signal of the previous stage scanning circuit, and an output terminal; a second transistor, comprising a control terminal coupled to the scanning signal of the previous stage scanning circuit, an input terminal coupled to the output terminal of the first transistor, and an output terminal outputting the scan voltage level signal; a third transistor, comprising a control terminal coupled to the output terminal of the second transistor, an input terminal coupled to a constant high voltage level supply, and an output terminal coupled to the input terminal of the second transistor.

Optionally, the scanning signal from the previous stage scanning circuit is the scanning signal from a previous four stage scanning circuit, and the scanning signal from the next stage scanning circuit is the scanning signal from a next five stage scanning circuit.

Optionally, the driving module comprises:

a fourth transistor, comprising a control terminal coupled to an output terminal of the pull-up control module, an input terminal coupled to the clock signal, and an output terminal outputting coupled to a start signal;

a fifth transistor, comprising a control terminal coupled to the output terminal of the pull-up control module, an input terminal coupled to the clock signal, and an output terminal outputting coupled to the scanning signal.

Optionally, the scanning driver further comprises a bootstrap capacitor, connected between the output terminal of the pull-up control module and the output terminal of the fifth transistor, for generating high voltage of the scanning signal of the current stage scanning circuit.

Optionally, the pull-down module comprises:

a sixth transistor comprising a control terminal coupled to scanning signal of the next stage scanning circuit, an input terminal coupled to the constant low voltage supply, and an output terminal coupled to the output terminal of the second transistor;

a seventh transistor comprising a control terminal coupled to the scanning signal of the next stage scanning circuit, an input terminal coupled to the constant low voltage supply, and an output terminal coupled to the output terminal of the driving module.

Optionally, the pull-down holding module comprises:

an eighth transistor comprising a control terminal coupled to a first reference node, an input terminal coupled to the constant low voltage supply, and an output terminal coupled to the output terminal of the second transistor;

a ninth transistor comprising a control terminal coupled to the first reference node, an input terminal coupled to the constant low voltage supply, and an output terminal coupled to the output terminal of the driving module;

a tenth transistor comprising a control terminal coupled to an output terminal of a twelfth transistor, an input terminal coupled to a first low frequency voltage level signal, and an output terminal coupled to the first reference node;

an eleventh transistor comprising a control terminal coupled to the output terminal of the second transistor, an input terminal coupled to the constant low voltage supply, and an output terminal coupled to the first reference node;

the twelfth transistor comprising a control terminal coupled to the first low frequency voltage level signal, and an input terminal coupled to the first low frequency voltage level signal;

a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

Optionally, the first low frequency voltage level signal are inverted to the second low frequency voltage level signal.

According to the present disclosure, a scanning driver for driving scan lines row by row is provided. The scanning driver comprises cascaded scanning circuits. Each scanning circuit comprises:

a pull-up control module, configured to generate a scan voltage level signal in response to a scanning signal from a previous stage scanning circuit;

a driving module, configured to pull up a scanning signal outputted to a scan line coupled to a current stage scanning circuit in response to the scan voltage level signal and a clock signal fed to the current stage scanning circuit;

a pull-down module, configured to pull down the scan voltage level signal in response to a scanning signal from a next stage scanning circuit;

a pull-down holding module, configured to hold the scan voltage level signal at a low voltage level; and a constant low voltage supply, configured to supply a constant low voltage, wherein the pull-up control module comprises: a first transistor comprising a control terminal coupled to the scanning signal of the previous stage scanning circuit, an input terminal coupled to the scanning signal of the previous stage scanning circuit, and an output terminal; a second transistor, comprising a control terminal coupled to the scanning signal of the previous stage scanning circuit, an input terminal coupled to the output terminal of the first transistor, and an output terminal outputting the scan voltage level signal; a third transistor, comprising a control terminal coupled to the output terminal of the second transistor, an input terminal coupled to an output terminal of the driving module, and an output terminal coupled to the input terminal of the second transistor.

Optionally, the scanning signal from the previous stage scanning circuit is the scanning signal from a previous four stage scanning circuit, and the scanning signal from the next stage scanning circuit is the scanning signal from a next five stage scanning circuit.

Optionally, the driving module comprises:

a fourth transistor, comprising a control terminal coupled to an output terminal of the pull-up control module, an input terminal coupled to the clock signal, and an output terminal outputting coupled to a start signal;

a fifth transistor, comprising a control terminal coupled to the output terminal of the pull-up control module, an input terminal coupled to the clock signal, and an output terminal outputting coupled to the scanning signal.

Optionally, the scanning driver further comprises a bootstrap capacitor, connected between the output terminal of the pull-up control module and the output terminal of the fifth transistor, for generating high voltage of the scanning signal of the current stage scanning circuit.

Optionally, the pull-down module comprises:

a sixth transistor comprising a control terminal coupled to scanning signal of the next stage scanning circuit, an input terminal coupled to the constant low voltage supply, and an output terminal coupled to the output terminal of the second transistor;

a seventh transistor comprising a control terminal coupled to the scanning signal of the next stage scanning circuit, an input terminal coupled to the constant low voltage supply, and an output terminal coupled to the output terminal of the driving module.

Optionally, the pull-down holding module comprises:

an eighth transistor comprising a control terminal coupled to a first reference node, an input terminal coupled to the constant low voltage supply, and an output terminal coupled to the output terminal of the second transistor;

a ninth transistor comprising a control terminal coupled to the first reference node, an input terminal coupled to the constant low voltage supply, and an output terminal coupled to the output terminal of the driving module;

a tenth transistor comprising a control terminal coupled to an output terminal of a twelfth transistor, an input terminal coupled to a first low frequency voltage level signal, and an output terminal coupled to the first reference node;

an eleventh transistor comprising a control terminal coupled to the output terminal of the second transistor, an input terminal coupled to the constant low voltage supply, and an output terminal coupled to the first reference node;

the twelfth transistor comprising a control terminal coupled to the first low frequency voltage level signal, and an input terminal coupled to the first low frequency voltage level signal;

a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

Optionally, the first low frequency voltage level signal are inverted to the second low frequency voltage level signal.

According to the present disclosure, a display device having a scanning driver for driving scan lines row by row is provided. The scanning driver comprises cascaded scanning circuits. Each scanning circuit comprises:

a pull-up control module, configured to generate a scan voltage level signal in response to a scanning signal from a previous stage scanning circuit;

a driving module, configured to pull up a scanning signal outputted to a scan line coupled to a current stage scanning circuit in response to the scan voltage level signal and a clock signal fed to the current stage scanning circuit;

a pull-down module, configured to pull down the scan voltage level signal in response to a scanning signal from a next stage scanning circuit;

a pull-down holding module, configured to hold the scan voltage level signal at a low voltage level; and a constant low voltage supply, configured to supply a constant low voltage, wherein the pull-up control module comprises: a first transistor comprising a control terminal coupled to the scanning signal of the previous stage scanning circuit, an input terminal coupled to the scanning signal of the previous stage scanning circuit, and an output terminal; a second transistor, comprising a control terminal coupled to the scanning signal of the previous stage scanning circuit, an input terminal coupled to the output terminal of the first transistor, and an output terminal outputting the scan voltage level signal; a third transistor, comprising a control terminal coupled to the output terminal of the second transistor, an input terminal coupled to a constant high voltage level supply, and an output terminal coupled to the input terminal of the second transistor.

Optionally, the scanning signal from the previous stage scanning circuit is the scanning signal from a previous four stage scanning circuit, and the scanning signal from the next stage scanning circuit is the scanning signal from a next five stage scanning circuit.

Optionally, the driving module comprises:

a fourth transistor, comprising a control terminal coupled to an output terminal of the pull-up control module, an input terminal coupled to the clock signal, and an output terminal outputting coupled to a start signal;

a fifth transistor, comprising a control terminal coupled to the output terminal of the pull-up control module, an input terminal coupled to the clock signal, and an output terminal outputting coupled to the scanning signal.

Optionally, the scanning driver further comprises a bootstrap capacitor, connected between the output terminal of the pull-up control module and the output terminal of the fifth transistor, for generating high voltage of the scanning signal of the current stage scanning circuit.

Optionally, the pull-down module comprises:

a sixth transistor comprising a control terminal coupled to scanning signal of the next stage scanning circuit, an input terminal coupled to the constant low voltage supply, and an output terminal coupled to the output terminal of the second transistor;

a seventh transistor comprising a control terminal coupled to the scanning signal of the next stage scanning circuit, an input terminal coupled to the constant low voltage supply, and an output terminal coupled to the output terminal of the driving module.

Optionally, the pull-down holding module comprises:

an eighth transistor comprising a control terminal coupled to a first reference node, an input terminal coupled to the constant low voltage supply, and an output terminal coupled to the output terminal of the second transistor;

a ninth transistor comprising a control terminal coupled to the first reference node, an input terminal coupled to the constant low voltage supply, and an output terminal coupled to the output terminal of the driving module;

a tenth transistor comprising a control terminal coupled to an output terminal of a twelfth transistor, an input terminal coupled to a first low frequency voltage level signal, and an output terminal coupled to the first reference node;

an eleventh transistor comprising a control terminal coupled to the output terminal of the second transistor, an input terminal coupled to the constant low voltage supply, and an output terminal coupled to the first reference node;

the twelfth transistor comprising a control terminal coupled to the first low frequency voltage level signal, and an input terminal coupled to the first low frequency voltage level signal;

a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

The present disclosure proposes a scanning driver and a display device. The scanning driver arranged on the display device utilizes the pull-up control module including a plurality of transistors. Compared with the conventional scanning driver and the conventional display device, the merits of the present disclosure are to prevent from leaking current and to enhance the reliability of the scanning driver. The present disclosure can solve the technical problem that the conventional scanning driver and the conventional display device are inclined to leak electricity, thereby enhancing the reliability of the scanning driver.

These and other features, aspects and advantages of the present disclosure will become understood with reference to the following description, appended claims and accompanying figures.

DETAILED DESCRIPTION OF THE PREFERRED EMBODIMENTS

Figure 1:
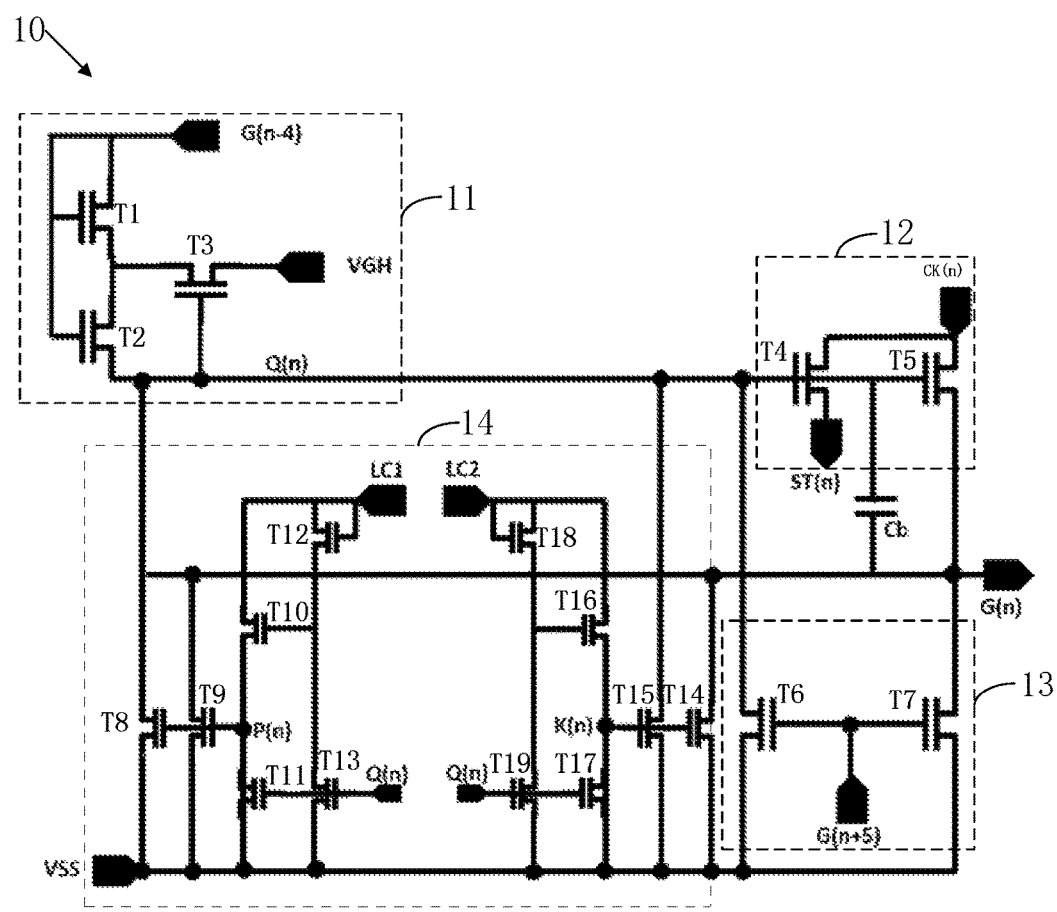
FIG. 1 illustrates a circuit diagram of a scanning driver according to a first embodiment of the present disclosure.

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

In the drawings, the components having similar structures are denoted by the same numerals.

Figure 2:
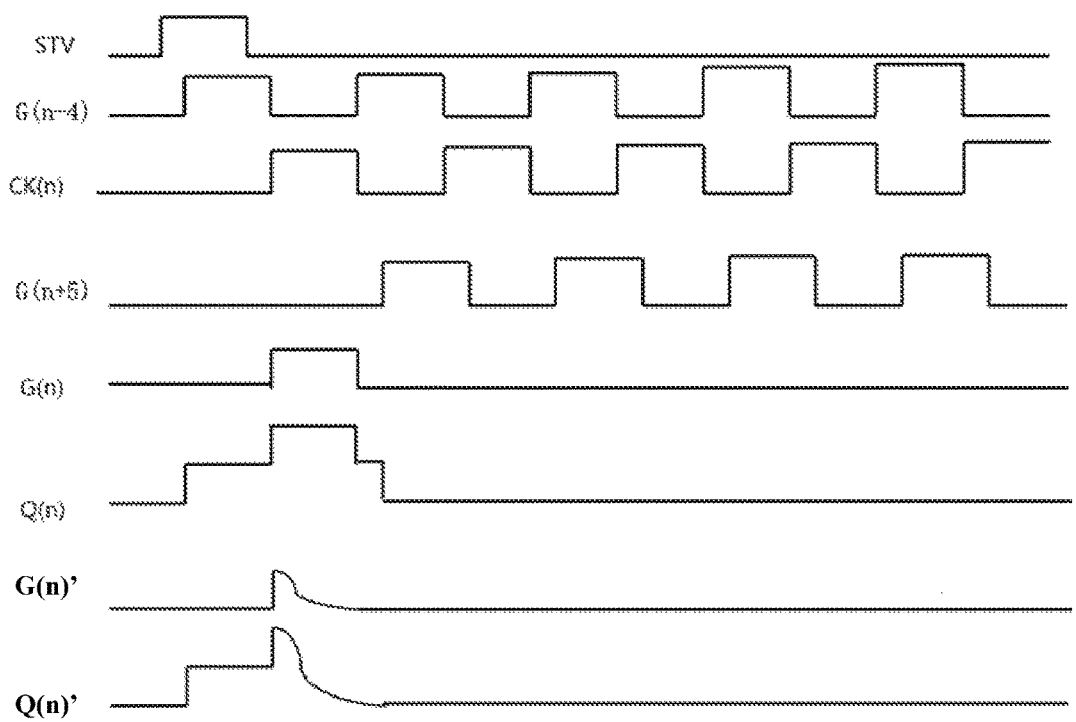
FIG. 2 illustrates waveforms of signals applied on the scanning driver according to the first embodiment of the present disclosure.

Please refer to FIG. 1 illustrating a circuit diagram of a scanning driver according to a first embodiment of the present disclosure, and FIG. 2 illustrating waveforms of signals applied on the scanning driver according to the first embodiment of the present disclosure. The scanning driver 10 for driving scan lines row by row, includes cascaded scanning circuits. Each scanning circuit includes a pull-up holding control module 11, a driving module 12, a pull-down holding module 14, a constant low voltage supply VSS, and a bootstrap capacitor Cb.

The pull-up control module 11 is configured to generate a scan voltage level signal Q(n) in response to a scanning signal from a previous stage scanning circuit. The driving module 12 is configured to pull up a scanning signal G(n) outputted to a scan line coupled to a current stage scanning circuit in response to the scan voltage level signal Q(n) and a clock signal CK(n) fed to the current stage scanning circuit. The pull-down module 13 is configured to pull down the scan voltage level signal Q(n) in response to a scanning signal from a next stage scanning circuit. The pull-down holding module 14 is configured to hold the scan voltage level signal Q(n) at a low voltage level. The constant low voltage supply VSS is configured to supply a constant low voltage. The bootstrap capacitor Cb, is used to generate high voltage of the scanning signal of the current stage scanning circuit G(n).

The pull-up control module 11 includes a first transistor T1, a second transistor T2, and a third transistor T3. The first transistor T1 includes a control terminal coupled to the scanning signal G(n−4) of the previous four stage scanning circuit, an input terminal coupled to the scanning signal G(n−4) of the previous four stage scanning circuit, and an output terminal. The second transistor T2 includes a control terminal coupled to the scanning signal G(n−4) of the previous four stage scanning circuit, an input terminal coupled to the output terminal of the first transistor T1, and an output terminal outputting the scan voltage level signal Q(n). The third transistor T3 includes a control terminal coupled to the output terminal of the second transistor T2, an input terminal coupled to a constant high voltage level supply VGH, and an output terminal coupled to the input terminal of the second transistor T2.

The driving module 12 includes a fourth transistor T4 and a fifth transistor T5. The fourth transistor T4 includes a control terminal coupled to an output terminal of the pull-up control module 11, an input terminal coupled to the clock signal CK(n), and an output terminal outputting coupled to a start signal ST(n). The fifth transistor T5 includes a control terminal coupled to the output terminal of the pull-up control module 11, an input terminal coupled to the clock signal CK(n), and an output terminal outputting coupled to the scanning signal G(n).

The bootstrap capacitor Cb is connected between the output terminal of the pull-up control module 11 and the output terminal of the fifth transistor T5.

The pull-down module 13 includes a sixth transistor T6 and a seventh transistor T7. The sixth transistor T6 includes a control terminal coupled to scanning signal G(n+5) of the next five stage scanning circuit, an input terminal coupled to the constant low voltage supply VSS, and an output terminal coupled to the output terminal of the second transistor T2. The seventh transistor T7 includes a control terminal coupled to the scanning signal G(n+5) of the next five stage scanning circuit, an input terminal coupled to the constant low voltage supply VSS, and an output terminal coupled to the output terminal of the driving module 12.

The pull-down holding module 14 includes an eighth transistor T8, a ninth transistor T9, a tenth transistor T10, an eleventh transistor T11, a twelfth transistor T12, a thirteenth transistor T13, a fourteenth transistor T14, a fifteenth transistor T15, a sixteenth transistor T16, a seventeenth transistor T17, an eighteenth transistor T18, and a nineteenth transistor T19.

The eighth transistor T8 includes a control terminal coupled to a first reference node P(n), an input terminal coupled to the constant low voltage supply VSS, and an output terminal coupled to the output terminal of the second transistor T2.

The ninth transistor T9 includes a control terminal coupled to the first reference node P(n), an input terminal coupled to the constant low voltage supply VSS, and an output terminal coupled to the output terminal of the driving module 12.

The tenth transistor T10 includes a control terminal coupled to an output terminal of the twelfth transistor T12, an input terminal coupled to a first low frequency voltage level signal LC1, and an output terminal coupled to the first reference node P(n).

The eleventh transistor T11 includes a control terminal coupled to the output terminal of the second transistor T2, an input terminal coupled to the constant low voltage supply VSS, and an output terminal coupled to the first reference node P(n).

The twelfth transistor T12 includes a control terminal coupled to the first low frequency voltage level signal LC1, and an input terminal coupled to the first low frequency voltage level signal LC1.

The thirteenth transistor T13 includes a control terminal coupled to the output terminal of the second transistor T2, an input terminal coupled to the constant low voltage supply VSS, and an output terminal coupled to the control terminal of the tenth transistor T10.

The fourteenth transistor T14 includes a control terminal coupled to a second reference node K(n), an input terminal coupled to the constant low voltage supply VSS, and an output terminal coupled to the output terminal of the second transistor T2.

The fifteenth transistor T15 includes a control terminal coupled to the second reference node K(n), an input terminal coupled to the constant low voltage supply VSS, and an output terminal coupled to the output terminal of the driving module 12.

The sixteenth transistor T16 includes a control terminal coupled to an output terminal of an eighteenth transistor T18, an input terminal coupled to a second low frequency voltage level signal LC2, and an output terminal coupled to the second reference node K(n).

The seventeenth transistor T17 includes a control terminal coupled to the output terminal of the second transistor T2, an input terminal coupled to the constant low voltage supply VSS, and an output terminal coupled to the second reference node K(n).

The eighteenth transistor T18 includes a control terminal coupled to the second low frequency voltage level signal LC2, and an input terminal coupled to the second low frequency voltage level signal LC2.

The nineteenth transistor T19 includes a control terminal coupled to the output terminal of the second transistor T2, an input terminal coupled to the constant low voltage supply VSS, and an output terminal coupled to the control terminal of the sixteenth transistor T16.

The first low frequency voltage level signal LC1 is inverted to the second low frequency voltage level signal LC2.

Please refer to FIG. 1 and FIG. 2. When the scanning signal G(n−4) of the previous four stage scanning circuit is at the high voltage level, the first transistor T1 and the second transistor T2 are conducted. The bootstrap capacitor Cb is charged by the scanning signal G(n−4) of the previous four stage scanning circuit through the first transistor T1 and the second transistor T2 to make the scan voltage level signal Q(n) rise to a higher voltage level. Afterwards, the scanning signal G(n−4) of the previous four stage scanning circuit is turned into the low voltage level. The first transistor T1 and the second transistor T2 are disconnected; the scan voltage level signal Q(n) maintains a higher voltage level through the bootstrap capacitor Cb. Meanwhile, the third transistor T3 is conducted because of the operation of the scan voltage level signal Q(n) at the high voltage level. The constant high voltage level supply VGH is connected to an input terminal of the second transistor T2 though the third transistor T3. As a result, the voltage difference between the input terminal and the output terminal reduces, and electricity does not leak from the second transistor T2 because of the variation of the voltage imposed on the scanning signal G(n−4) of the previous four stage scanning circuit. The reliability of the scanning driver 10 enhances accordingly.

The following clock signal CK(n) is turned into a high voltage level. The clock signal CK(n) continues charging the bootstrap capacitor Cb through the fifth transistor T5 to make the scan voltage level signal Q(n) reach a higher voltage level. The current stage scanning signal G(n) is turned into a high voltage level as well.

At this time, the fourth transistor T4 and the fifth transistor T5 are conducted. A current stage scanning signal G(n) is output through the terminal of the fifth transistor T5. A current stage start signal ST(n) is output through the terminal of the fourth transistor T4.

The eleventh transistor T11, the thirteenth transistor T13, the seventeenth transistor T17, and the nineteenth transistor T19 are conducted because of the operation of the scan voltage level signal Q(n) at the high voltage level. So the first reference node P(n) and the second reference node K(n) keep the high voltage level under the control of the constant low voltage supply VSS. So the eighth transistor T8, the ninth transistor T9, the fourteenth transistor T14, and the fifteenth transistor T15 keep disconnected, which ensures that the scan voltage level signal Q(n) is at the high voltage level.

When a scanning signal G(n+5) of the next five stage scanning circuit is turned into a high voltage level, a sixth transistor T6 and a seventh transistor T7 are conducted, and the scan voltage level signal Q(n) is pulled to a low voltage level by the constant low voltage supply VSS. Meanwhile, the eleventh transistor T11, the thirteenth transistor T13, the seventeenth transistor T17, and the nineteenth transistor T19 are disconnected. The pull-down holding module 14 holds the low voltage level of the scan voltage level signal Q(n) because of the operation of a first low frequency voltage level signal LC1 and a second low frequency voltage level signal LC2.

When the first low frequency voltage level signal LC1 is at the high voltage level and the second low frequency voltage level signal LC2 is at the low voltage level, the twelfth transistor T12 and the tenth transistor T10 are conducted. The first reference node P(n) is pulled to the high voltage level through the tenth transistor T10. The eighth transistor T8 and the ninth transistor T9 are conducted. The scan voltage level signal Q(n) is connected to the constant low voltage supply VSS through the eighth transistor T8, which keeps the scan voltage level signal Q(n) at the low voltage level. The current stage scanning signal G(n) is connected to the constant low voltage supply VSS through the ninth transistor T9, which keeps the current stage scanning signal G(n) at the low voltage level.

When the first low frequency voltage level signal LC1 is at the low voltage level and the second low frequency voltage level signal LC2 is at the high voltage level, the sixteenth transistor T16 and the eighteenth transistor T18 are conducted. The second reference node K(n) is pulled to the high voltage level through the sixteenth transistor T16. The fourteenth transistor T14 and the fifteenth transistor T15 are conducted. The scan voltage level signal Q(n) is connected to the constant low voltage supply VSS through the fifteenth transistor T15, which keeps the scan voltage level signal Q(n) at the low voltage level. The current stage scanning signal G(n) is connected to the constant low voltage supply VSS through the fourteenth transistor T14, which keeps the current stage scanning signal G(n) at the low voltage level.

To sum up, because the first transistor T1, the second transistor T2, and the third transistor T3 are arranged on the pull-up holding control module 11 of the scanning driver 10, the scanning signal G(n−4) of the previous four stage scanning circuit is turned into the low voltage level. The scan voltage level signal Q(n) keeps at the high voltage level better, which prevents current from being leaked.

Please refer to FIG. 2 carefully. The current stage scanning signal G(n) and the scan voltage level signal Q(n) are the scanning signal and the scan voltage level signal in the scanning driver 10 proposed by embodiment of the present disclosure. The current stage scanning signal G(n)' and the scan voltage level signal Q(n)' are the scanning signal and the scan voltage level signal in the conventional scanning driver. As FIG. 2 shows, the waveform of the current stage scanning signal G(n) and the waveform of the scan voltage level signal Q(n) are improved more obviously under the operation of the pull-up holding control module 11.

The pull-up control module including the plurality of transistors is arranged on the scanning driver 10 proposed by embodiment of the present disclosure. Such a design is beneficial to prevent electricity from leaking and enhance the stability of the scanning driver 10.

Figure 3:
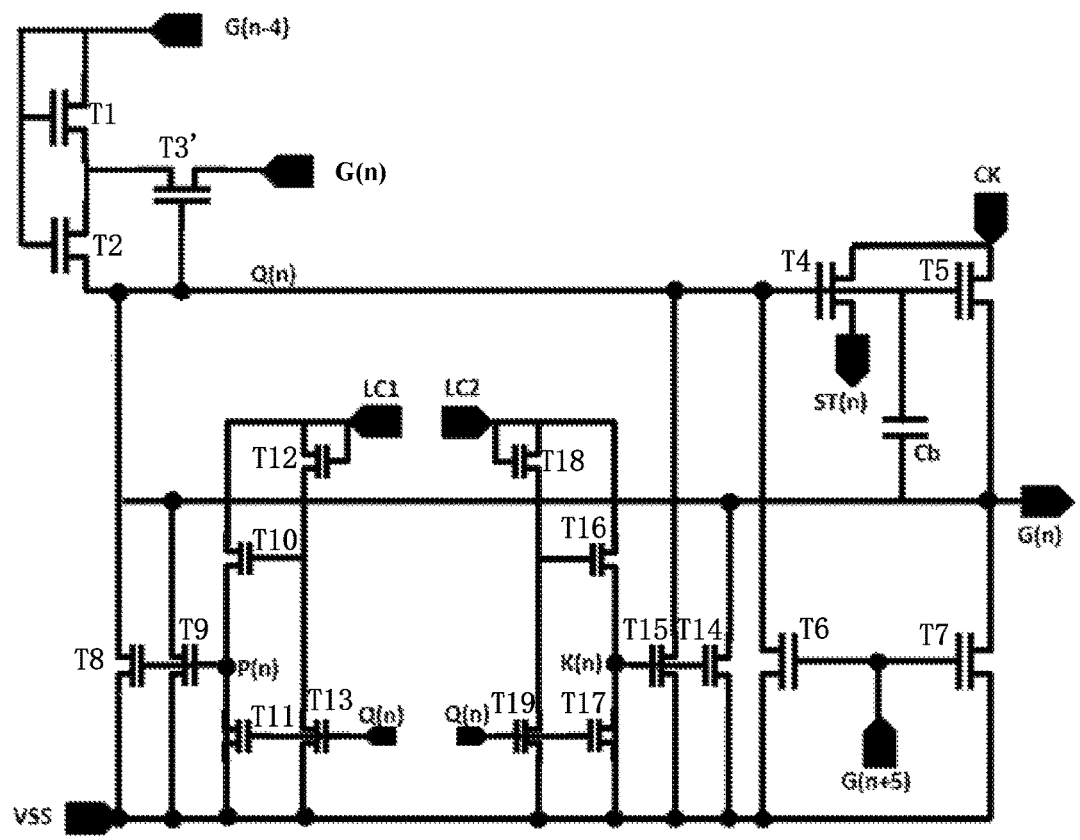
FIG. 3 illustrates a circuit diagram of a scanning driver according to a second embodiment of the present disclosure.

Please refer to FIG. 3 illustrating a circuit diagram of a scanning driver according to a second embodiment of the present disclosure. Based on the first embodiment, an input terminal of a third transistor T3' of a pull-up control module of the scanning driver is connected to an output terminal of a driving module; that is, a current stage scanning signal G(n) is input to the third transistor T3'. The arrangement also makes the scan voltage level signal Q(n) keep the high voltage level. Further, it is unnecessary to use an additional constant high voltage level supply VGH.

The specific operating principle of the scanning driver proposed by the second embodiment is the same as or similar to the scanning driver proposed by the first embodiment so the details of the scanning driver can refer to the first embodiment.

The present disclosure also proposes a display device including a scanning driver for driving scan lines row by row. The scanning driver includes cascaded scanning circuits. Each scanning circuit includes a pull-up holding control module 11, a driving module 12, a pull-down holding module 14, a constant low voltage supply VSS, and a bootstrap capacitor Cb as illustrated in FIG. 1.

The pull-up control module 11 is configured to generate a scan voltage level signal Q(n) in response to a scanning signal from a previous stage scanning circuit. The driving module 12 is configured to pull up a scanning signal G(n) outputted to a scan line coupled to a current stage scanning circuit in response to the scan voltage level signal Q(n) and a clock signal CK(n) fed to the current stage scanning circuit. The pull-down module 13 is configured to pull down the scan voltage level signal Q(n) in response to a scanning signal from a next stage scanning circuit. The pull-down holding module 14 is configured to hold the scan voltage level signal Q(n) at a low voltage level. The constant low voltage supply VSS is configured to supply a constant low voltage. The bootstrap capacitor Cb, is used to generate high voltage of the scanning signal of the current stage scanning circuit G(n).

The pull-up control module 11 includes a first transistor T1, a second transistor T2, and a third transistor T3. The first transistor T1 includes a control terminal coupled to the scanning signal G(n−4) of the previous four stage scanning circuit, an input terminal coupled to the scanning signal G(n−4) of the previous four stage scanning circuit, and an output terminal. The second transistor T2 includes a control terminal coupled to the scanning signal G(n−4) of the previous four stage scanning circuit, an input terminal coupled to the output terminal of the first transistor T1, and an output terminal outputting the scan voltage level signal Q(n). The third transistor T3 includes a control terminal coupled to the output terminal of the second transistor T2, an input terminal coupled to a constant high voltage level supply VGH, and an output terminal coupled to the input terminal of the second transistor T2.

Preferably, the scanning signal G(n−4) of the previous four stage scanning circuit and scanning signal G(n+5) of the next five stage scanning circuit are used in the present disclosure.

Preferably, the driving module 12 includes a fourth transistor T4 and a fifth transistor T5. The fourth transistor T4 includes a control terminal coupled to an output terminal of the pull-up control module 11, an input terminal coupled to the clock signal CK(n), and an output terminal outputting coupled to a start signal ST(n). The fifth transistor T5 includes a control terminal coupled to the output terminal of the pull-up control module 11, an input terminal coupled to the clock signal CK(n), and an output terminal outputting coupled to the scanning signal G(n).

Preferably, the bootstrap capacitor Cb is connected between the output terminal of the pull-up control module 11 and the output terminal of the fifth transistor T5.

Preferably, the pull-down module 13 includes a sixth transistor T6 and a seventh transistor T7. The sixth transistor T6 includes a control terminal coupled to scanning signal G(n+5) of the next five stage scanning circuit, an input terminal coupled to the constant low voltage supply VSS, and an output terminal coupled to the output terminal of the second transistor T2. The seventh transistor T7 includes a control terminal coupled to the scanning signal G(n+5) of the next five stage scanning circuit, an input terminal coupled to the constant low voltage supply VSS, and an output terminal coupled to the output terminal of the driving module 12.

Preferably, the pull-down holding module 14 includes an eighth transistor T8, a ninth transistor T9, a tenth transistor T10, an eleventh transistor T11, a twelfth transistor T12, a thirteenth transistor T13, a fourteenth transistor T14, a fifteenth transistor T15, a sixteenth transistor T16, a seventeenth transistor T17, an eighteenth transistor T18, and a nineteenth transistor T19. The eighth transistor T8 includes a control terminal coupled to a first reference node P(n), an input terminal coupled to the constant low voltage supply VSS, and an output terminal coupled to the output terminal of the second transistor T2. The ninth transistor T9 includes a control terminal coupled to the first reference node P(n), an input terminal coupled to the constant low voltage supply VSS, and an output terminal coupled to the output terminal of the driving module 12. The tenth transistor T10 includes a control terminal coupled to an output terminal of the twelfth transistor T12, an input terminal coupled to a first low frequency voltage level signal LC1, and an output terminal coupled to the first reference node P(n). The eleventh transistor T11 includes a control terminal coupled to the output terminal of the second transistor T2, an input terminal coupled to the constant low voltage supply VSS, and an output terminal coupled to the first reference node P(n). The twelfth transistor T12 includes a control terminal coupled to the first low frequency voltage level signal LC1, and an input terminal coupled to the first low frequency voltage level signal LC1. The thirteenth transistor T13 includes a control terminal coupled to the output terminal of the second transistor T2, an input terminal coupled to the constant low voltage supply VSS, and an output terminal coupled to the control terminal of the tenth transistor T10. The fourteenth transistor T14 includes a control terminal coupled to a second reference node K(n), an input terminal coupled to the constant low voltage supply VSS, and an output terminal coupled to the output terminal of the second transistor T2. The fifteenth transistor T15 includes a control terminal coupled to the second reference node K(n), an input terminal coupled to the constant low voltage supply VSS, and an output terminal coupled to the output terminal of the driving module 12. The sixteenth transistor T16 includes a control terminal coupled to an output terminal of an eighteenth transistor T18, an input terminal coupled to a second low frequency voltage level signal LC2, and an output terminal coupled to the second reference node K(n). The seventeenth transistor T17 includes a control terminal coupled to the output terminal of the second transistor T2, an input terminal coupled to the constant low voltage supply VSS, and an output terminal coupled to the second reference node K(n). The eighteenth transistor T18 includes a control terminal coupled to the second low frequency voltage level signal LC2, and an input terminal coupled to the second low frequency voltage level signal LC2. The nineteenth transistor T19 includes a control terminal coupled to the output terminal of the second transistor T2, an input terminal coupled to the constant low voltage supply VSS, and an output terminal coupled to the control terminal of the sixteenth transistor T16.

Preferably, the first low frequency voltage level signal LC1 is inverted to the second low frequency voltage level signal LC2.

The specific operating principle of the scanning driver of the display device is the same as or similar to the scanning driver proposed by the first embodiment so the details of the scanning driver can refer to the first embodiment.

The present disclosure proposes a scanning driver and a display device. The scanning driver arranged on the display device utilizes the pull-up control module including a plurality of transistors. Compared with the conventional scanning driver and the conventional display device, the merits of the present disclosure are to prevent from leaking current and to enhance the reliability of the scanning driver. The present disclosure can solve the technical problem that the conventional scanning driver and the conventional display device are inclined to leak electricity, thereby enhancing the reliability of the scanning driver.

As the above, it should be understood that the present disclosure has been described with reference to certain preferred and alternative embodiments which are intended to be exemplary only and do not limit the full scope of the present disclosure as set forth in the appended claims.

What is claimed is:

1. A scanning driver for driving scan lines row by row, the scanning driver comprising cascaded scanning circuits, each scanning circuit comprising:
    a pull-up control module, configured to generate a scan voltage level signal in response to a scanning signal from a previous stage scanning circuit;
    a driving module, configured to pull up a scanning signal outputted to a scan line coupled to a current stage scanning circuit in response to the scan voltage level signal and a clock signal fed to the current stage scanning circuit;
    a pull-down module, configured to pull down the scan voltage level signal in response to a scanning signal from a next stage scanning circuit;
    a pull-down holding module, configured to hold the scan voltage level signal at a low voltage level; and
    a constant low voltage supply, configured to supply a constant low voltage,
    wherein the pull-up control module comprises:
        a first transistor comprising a control terminal coupled to the scanning signal of the previous stage scanning circuit, an input terminal coupled to the scanning signal of the previous stage scanning circuit, and an output terminal;
        a second transistor, comprising a control terminal coupled to the scanning signal of the previous stage scanning circuit, an input terminal coupled to the output terminal of the first transistor, and an output terminal outputting the scan voltage level signal;
        a third transistor, comprising a control terminal coupled to the output terminal of the second transistor, an input terminal coupled to a constant high voltage level supply, and an output terminal coupled to the input terminal of the second transistor.

2. The scanning driver of claim 1, wherein the scanning signal from the previous stage scanning circuit is the scanning signal from a previous four stage scanning circuit, and the scanning signal from the next stage scanning circuit is the scanning signal from a next five stage scanning circuit.

3. The scanning driver of claim 1, wherein the driving module comprises:
    a fourth transistor, comprising a control terminal coupled to an output terminal of the pull-up control module, an input terminal coupled to the clock signal, and an output terminal outputting coupled to a start signal;
    a fifth transistor, comprising a control terminal coupled to the output terminal of the pull-up control module, an input terminal coupled to the clock signal, and an output terminal outputting coupled to the scanning signal.

4. The scanning driver of claim 3, further comprising a bootstrap capacitor, connected between the output terminal of the pull-up control module and the output terminal of the fifth transistor, for generating high voltage of the scanning signal of the current stage scanning circuit.

5. The scanning driver of claim 1, wherein the pull-down module comprises:
    a sixth transistor comprising a control terminal coupled to scanning signal of the next stage scanning circuit, an input terminal coupled to the constant low voltage supply, and an output terminal coupled to the output terminal of the second transistor;
    a seventh transistor comprising a control terminal coupled to the scanning signal of the next stage scanning circuit, an input terminal coupled to the constant low voltage supply, and an output terminal coupled to the output terminal of the driving module.

6. The scanning driver of claim 1, wherein the pull-down holding module comprises:
    an eighth transistor comprising a control terminal coupled to a first reference node, an input terminal coupled to the constant low voltage supply, and an output terminal coupled to the output terminal of the second transistor;
    a ninth transistor comprising a control terminal coupled to the first reference node, an input terminal coupled to the constant low voltage supply, and an output terminal coupled to the output terminal of the driving module;
    a tenth transistor comprising a control terminal coupled to an output terminal of a twelfth transistor, an input terminal coupled to a first low frequency voltage level signal, and an output terminal coupled to the first reference node;
    an eleventh transistor comprising a control terminal coupled to the output terminal of the second transistor, an input terminal coupled to the constant low voltage supply, and an output terminal coupled to the first reference node;

the twelfth transistor comprising a control terminal coupled to the first low frequency voltage level signal, and an input terminal coupled to the first low frequency voltage level signal;

a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

7. The scanning driver of claim 6, wherein the first low frequency voltage level signal are inverted to the second low frequency voltage level signal.

8. A scanning driver for driving scan lines row by row, the scanning driver comprising cascaded scanning circuits, each scanning circuit comprising:

a pull-up control module, configured to generate a scan voltage level signal in response to a scanning signal from a previous stage scanning circuit;

a driving module, configured to pull up a scanning signal outputted to a scan line coupled to a current stage scanning circuit in response to the scan voltage level signal and a clock signal fed to the current stage scanning circuit;

a pull-down module, configured to pull down the scan voltage level signal in response to a scanning signal from a next stage scanning circuit;

a pull-down holding module, configured to hold the scan voltage level signal at a low voltage level; and a constant low voltage supply, configured to supply a constant low voltage, wherein the pull-up control module comprises:

a first transistor comprising a control terminal coupled to the scanning signal of the previous stage scanning circuit, an input terminal coupled to the scanning signal of the previous stage scanning circuit, and an output terminal;

a second transistor, comprising a control terminal coupled to the scanning signal of the previous stage scanning circuit, an input terminal coupled to the output terminal of the first transistor, and an output terminal outputting the scan voltage level signal;

a third transistor, comprising a control terminal coupled to the output terminal of the second transistor, an input terminal coupled to an output terminal of the driving module, and an output terminal coupled to the input terminal of the second transistor.

9. The scanning driver of claim 8, wherein the scanning signal from the previous stage scanning circuit is the scanning signal from a previous four stage scanning circuit, and the scanning signal from the next stage scanning circuit is the scanning signal from a next five stage scanning circuit.

10. The scanning driver of claim 8, wherein the driving module comprises:

a fourth transistor, comprising a control terminal coupled to an output terminal of the pull-up control module, an input terminal coupled to the clock signal, and an output terminal outputting coupled to a start signal;

a fifth transistor, comprising a control terminal coupled to the output terminal of the pull-up control module, an input terminal coupled to the clock signal, and an output terminal outputting coupled to the scanning signal.

11. The scanning driver of claim 10, further comprising a bootstrap capacitor, connected between the output terminal of the pull-up control module and the output terminal of the fifth transistor, for generating high voltage of the scanning signal of the current stage scanning circuit.

12. The scanning driver of claim 8, wherein the pull-down module comprises:

a sixth transistor comprising a control terminal coupled to scanning signal of the next stage scanning circuit, an input terminal coupled to the constant low voltage supply, and an output terminal coupled to the output terminal of the second transistor;

a seventh transistor comprising a control terminal coupled to the scanning signal of the next stage scanning circuit, an input terminal coupled to the constant low voltage supply, and an output terminal coupled to the output terminal of the driving module.

13. The scanning driver of claim 8, wherein the pull-down holding module comprises:

an eighth transistor comprising a control terminal coupled to a first reference node, an input terminal coupled to the constant low voltage supply, and an output terminal coupled to the output terminal of the second transistor;

a ninth transistor comprising a control terminal coupled to the first reference node, an input terminal coupled to the constant low voltage supply, and an output terminal coupled to the output terminal of the driving module;

a tenth transistor comprising a control terminal coupled to an output terminal of a twelfth transistor, an input terminal coupled to a first low frequency voltage level signal, and an output terminal coupled to the first reference node;

an eleventh transistor comprising a control terminal coupled to the output terminal of the second transistor, an input terminal coupled to the constant low voltage supply, and an output terminal coupled to the first reference node;

the twelfth transistor comprising a control terminal coupled to the first low frequency voltage level signal, and an input terminal coupled to the first low frequency voltage level signal;

a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

14. The scanning driver of claim 13, wherein the first low frequency voltage level signal are inverted to the second low frequency voltage level signal.

15. A display device comprising a scanning driver for driving scan lines row by row, the scanning driver comprising cascaded scanning circuits, each scanning circuit comprising:
a pull-up control module, configured to generate a scan voltage level signal in response to a scanning signal from a previous stage scanning circuit;
a driving module, configured to pull up a scanning signal outputted to a scan line coupled to a current stage scanning circuit in response to the scan voltage level signal and a clock signal fed to the current stage scanning circuit;
a pull-down module, configured to pull down the scan voltage level signal in response to a scanning signal from a next stage scanning circuit;
a pull-down holding module, configured to hold the scan voltage level signal at a low voltage level; and
a constant low voltage supply, configured to supply a constant low voltage,
wherein the pull-up control module comprises:
a first transistor comprising a control terminal coupled to the scanning signal of the previous stage scanning circuit, an input terminal coupled to the scanning signal of the previous stage scanning circuit, and an output terminal;
a second transistor, comprising a control terminal coupled to the scanning signal of the previous stage scanning circuit, an input terminal coupled to the output terminal of the first transistor, and an output terminal outputting the scan voltage level signal;
a third transistor, comprising a control terminal coupled to the output terminal of the second transistor, an input terminal coupled to a constant high voltage level supply, and an output terminal coupled to the input terminal of the second transistor.

16. The display device of claim 15, wherein the scanning signal from the previous stage scanning circuit is the scanning signal from a previous four stage scanning circuit, and the scanning signal from the next stage scanning circuit is the scanning signal from a next five stage scanning circuit.

17. The display device of claim 15, wherein the driving module comprises:
a fourth transistor, comprising a control terminal coupled to an output terminal of the pull-up control module, an input terminal coupled to the clock signal, and an output terminal outputting coupled to a start signal;
a fifth transistor, comprising a control terminal coupled to the output terminal of the pull-up control module, an input terminal coupled to the clock signal, and an output terminal outputting coupled to the scanning signal.

18. The display device of claim 17, wherein the scanning driver further comprises a bootstrap capacitor, connected between the output terminal of the pull-up control module and the output terminal of the fifth transistor, for generating high voltage of the scanning signal of the current stage scanning circuit.

19. The display device of claim 15, wherein the pull-down module comprises:
a sixth transistor comprising a control terminal coupled to scanning signal of the next stage scanning circuit, an input terminal coupled to the constant low voltage supply, and an output terminal coupled to the output terminal of the second transistor;
a seventh transistor comprising a control terminal coupled to the scanning signal of the next stage scanning circuit, an input terminal coupled to the constant low voltage supply, and an output terminal coupled to the output terminal of the driving module.

20. The display device of claim 15, wherein the pull-down holding module comprises:
an eighth transistor comprising a control terminal coupled to a first reference node, an input terminal coupled to the constant low voltage supply, and an output terminal coupled to the output terminal of the second transistor;
a ninth transistor comprising a control terminal coupled to the first reference node, an input terminal coupled to the constant low voltage supply, and an output terminal coupled to the output terminal of the driving module;
a tenth transistor comprising a control terminal coupled to an output terminal of a twelfth transistor, an input terminal coupled to a first low frequency voltage level signal, and an output terminal coupled to the first reference node;
an eleventh transistor comprising a control terminal coupled to the output terminal of the second transistor, an input terminal coupled to the constant low voltage supply, and an output terminal coupled to the first reference node;
the twelfth transistor comprising a control terminal coupled to the first low frequency voltage level signal, and an input terminal coupled to the first low frequency voltage level signal;
a thirteenth transistor comprising a control terminal coupled to the output terminal of the second transistor, an input terminal coupled to the constant low voltage supply, and an output terminal coupled to the control terminal of the tenth transistor;

a fourteenth transistor comprising a control terminal coupled to a second reference node, an input terminal coupled to the constant low voltage supply, and an output terminal coupled to the output terminal of the second transistor;

a fifteenth transistor comprising a control terminal coupled to the second reference node, an input terminal coupled to the constant low voltage supply, and an output terminal coupled to the output terminal of the driving module;

a sixteenth transistor comprising a control terminal coupled to an output terminal of an eighteenth transistor, an input terminal coupled to a second low frequency voltage level signal, and an output terminal coupled to the second reference node;

a seventeenth transistor comprising a control terminal coupled to the output terminal of the second transistor, an input terminal coupled to the constant low voltage supply, and an output terminal coupled to the second reference node;

the eighteenth transistor comprising a control terminal coupled to the second low frequency voltage level signal, and an input terminal coupled to the second low frequency voltage level signal; and a nineteenth transistor comprising a control terminal coupled to the output terminal of the second transistor, an input terminal coupled to the constant low voltage supply, and an output terminal coupled to the control terminal of the sixteenth transistor.

* * * * *